(12) United States Patent
Janik et al.

(10) Patent No.: US 8,199,506 B2
(45) Date of Patent: Jun. 12, 2012

(54) SOLID STATE DATA STORAGE ASSEMBLY

(75) Inventors: Peter R. Janik, Shakopee, MN (US); Darren E. Johnston, Burnsville, MN (US); Gordon A. Harwood, Prior Lake, MN (US)

(73) Assignee: Seagate Technology, LLC, Scotts Valley, CA (US)

( * ) Notice: Subject to any disclaimer, the term of this patent is extended or adjusted under 35 U.S.C. 154(b) by 302 days.

(21) Appl. No.: 12/542,502

(22) Filed: Aug. 17, 2009

(65) Prior Publication Data

US 2011/0038123 A1 Feb. 17, 2011

(51) Int. Cl.
*H05K 7/20* (2006.01)
(52) U.S. Cl. ......... 361/708; 361/704; 361/715; 361/719
(58) Field of Classification Search ..................... None
See application file for complete search history.

(56) References Cited

U.S. PATENT DOCUMENTS

| | | | | |
|---|---|---|---|---|
| 3,577,821 A * | 5/1971 | Medendorp | .............. | 83/238 |
| 4,288,839 A * | 9/1981 | Prager et al. | .............. | 361/717 |
| 4,654,754 A * | 3/1987 | Daszkowski | .............. | 361/708 |
| 4,694,119 A | 9/1987 | Groenewegen | | |
| 4,833,347 A * | 5/1989 | Rabe | .............. | 326/23 |
| 4,944,401 A | 7/1990 | Groenewegen | | |
| 5,060,114 A * | 10/1991 | Feinberg et al. | .............. | 361/706 |
| 5,373,189 A * | 12/1994 | Massit et al. | .............. | 257/686 |
| 5,596,486 A * | 1/1997 | Young et al. | .............. | 361/737 |
| 6,011,690 A * | 1/2000 | Hughes et al. | .............. | 361/704 |
| 6,188,576 B1 * | 2/2001 | Ali et al. | .............. | 361/704 |
| 6,252,776 B1 * | 6/2001 | Saito et al. | .............. | 361/719 |
| 6,353,538 B1 * | 3/2002 | Ali et al. | .............. | 361/728 |
| 6,400,565 B1 | 6/2002 | Shabbir et al. | | |
| 6,443,306 B1 | 9/2002 | Davies et al. | | |
| 6,465,728 B1 * | 10/2002 | McLaughlin et al. | ....... | 174/16.3 |
| 6,546,621 B2 * | 4/2003 | Wang | .............. | 29/841 |
| 6,735,043 B2 | 5/2004 | Bernett et al. | | |
| 6,786,998 B1 * | 9/2004 | Cleeves | .............. | 156/345.51 |
| 6,900,163 B2 * | 5/2005 | Khatri | .............. | 508/155 |
| 6,940,721 B2 * | 9/2005 | Hill | .............. | 361/708 |
| 7,023,699 B2 * | 4/2006 | Glovatsky et al. | .............. | 361/704 |
| 7,230,831 B2 * | 6/2007 | Luckner et al. | .............. | 361/719 |
| 2003/0011993 A1 * | 1/2003 | Summers et al. | .............. | 361/704 |
| 2005/0010315 A1 | 1/2005 | Silverman | | |
| 2009/0077389 A1 | 3/2009 | Matthews, Jr. | | |
| 2009/0086448 A1 | 4/2009 | Hiew et al. | | |

* cited by examiner

*Primary Examiner* — Gregory Thompson
(74) *Attorney, Agent, or Firm* — Hollingsworth & Funk, LLC (57) ABSTRACT

A solid state data storage assembly includes thermal interface material that conducts heat away from electrical components of the assembly. In some examples, the thermal interface material is positioned between a printed circuit board assembly, which includes electrical components, and a cover of a housing of the data storage assembly. The thermal interface material may also provide shock protection for the data storage assembly by at least one of increasing a stiffness of the data storage assembly, absorbing some mechanical loads applied to the data storage assembly or distributing the applied loads. In addition, in some examples, the thermal interface material exhibits some tackiness, such that removal of a thermal interface material from a data storage assembly and subsequent repositioning of the thermal interface material within the data storage assembly may provide a visual indication of tampering.

17 Claims, 4 Drawing Sheets

SOLID STATE DATA STORAGE ASSEMBLY

TECHNICAL FIELD

The invention relates to a data storage device, and more particularly, a solid state data storage assembly.

BACKGROUND

Solid state data storage is an advancing technology for data storage applications. Solid state data storage devices differ from non-solid state devices in that they typically have no moving parts and include memory chips to store data. Examples of solid state memory components used for solid state data storage include flash memory and magnetic random access memory (MRAM).

SUMMARY

In general, the disclosure is directed to solid state data storage assembly that includes a printed circuit board assembly with electrical components (e.g., a solid state memory component) and a thermally conductive material (also referred to as a "thermal interface material") that conducts heat away from the electrical components of the printed circuit board assembly. In some examples, the thermally conductive material is positioned between the printed circuit board assembly and a cover of a housing of the solid state data storage assembly. In addition to conducting heat away from the electrical components of the printed circuit board assembly, the thermally conductive material may act as a shock protector. That is, the thermally conductive material may help mitigate or even prevent damage to the data storage assembly that may result from the application of a shock to the data storage assembly.

In one aspect, the disclosure is directed to an assembly comprising a printed circuit board assembly comprising a solid state memory component, a housing comprising a cover, wherein the housing substantially encloses the printed circuit board assembly, and a thermal interface positioned between the cover and the printed circuit board assembly. The thermal interface conducts heat away from the printed circuit board assembly.

In another aspect, the disclosure is directed to a solid state drive assembly comprising a printed circuit board assembly, a housing substantially enclosing the printed circuit board assembly, and a thermally conductive material positioned between the housing and the printed circuit board assembly. The thermally conductive material contacts the housing and the printed circuit board assembly.

In another aspect, the disclosure is directed to a method comprising placing a printed circuit board assembly within a housing, wherein the printed circuit board assembly comprises a solid state memory component, placing a thermal interface over the printed circuit board assembly, and attaching a cover to the housing, wherein the thermal interface is positioned between the cover and the printed circuit board assembly.

The details of one or more examples of the invention are set forth in the accompanying drawings and the description below. Other features, objects, and advantages of the invention will be apparent from the description and drawings, and from the claims.

DETAILED DESCRIPTION

Figure 1:
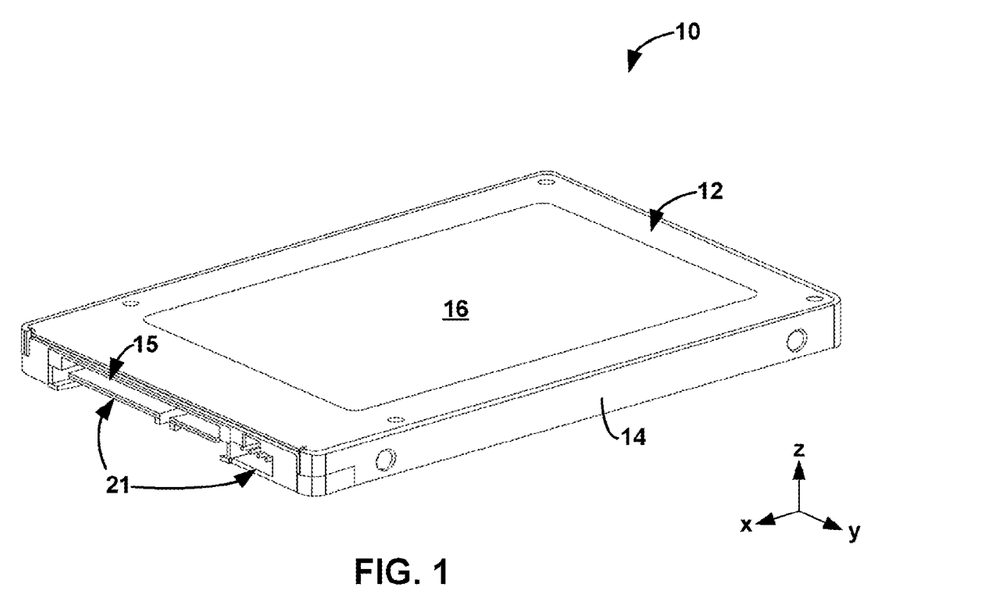
FIG. 1 is a perspective view of an example solid state data storage assembly.

FIG. 1 is a perspective view of an example solid state data storage assembly 10, which can be a non-volatile data storage assembly. Solid state data storage assembly 10 may also be referred to as a solid-state drive. Data storage assembly 10 is suitable for use in various applications, such as computing devices, portable electronic devices or other devices that store data. Solid state data storage assembly 10 differs from non-solid state devices, such as disc drives, in that solid state data storage assembly 10 typically does not have moving parts.

Data storage assembly 10 includes outer housing 12, which is defined by frame 14, first cover 16, and a second cover 18 (shown in FIG. 2), where first and second covers 16, 18 are mechanically coupled to opposite sides of frame 12 to define a space within which electrical components of data storage assembly 10 are enclosed. Covers 16, 18 can be mechanically connected to housing 12 using any suitable technique, such as using one or more screws, connection fingers, locking/clipping structures, adhesives, rivets, other mechanical fasteners, welding (e.g., ultrasonic welding) or combinations thereof. Housing 12 may be formed from any suitable material, such as metal (e.g., aluminum), plastic, or other suitable material or combinations thereof. Housing 12 substantially encloses at least one printed circuit board assembly (not shown in FIG. 1), which includes electrical components, such as memory components (e.g., flash memory, magnetic random access memory (MRAM), static random access memory (SRAM) or dynamic random access memory (DRAM) chips) that store data and one or more controllers.

Figure 2:
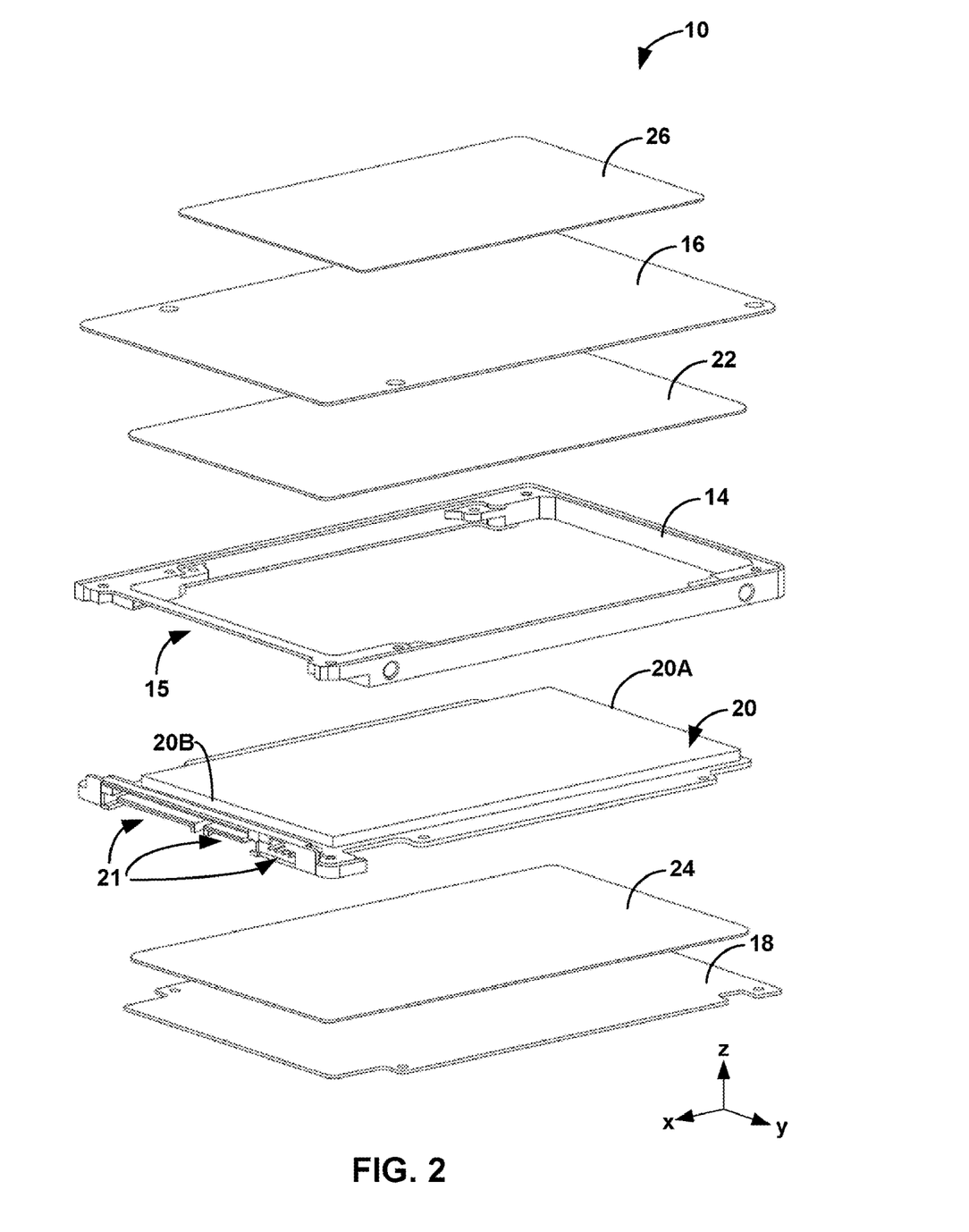
FIG. 2 is an exploded perspective view of the example solid state data storage assembly of FIG. 1.

FIG. 2 is an exploded perspective view of data storage assembly 10. The example data storage assembly 10 shown in FIGS. 1 and 2 includes frame 14, first cover 16, second cover 18, printed circuit board assembly 20, thermal interfaces 22, 24, and label 26. Label 26 may indicate the parameters of data storage assembly 10, e.g., the memory capacity. In other examples, data storage assembly 10 does not include label 26 or may include more than one label.

Figure 3:
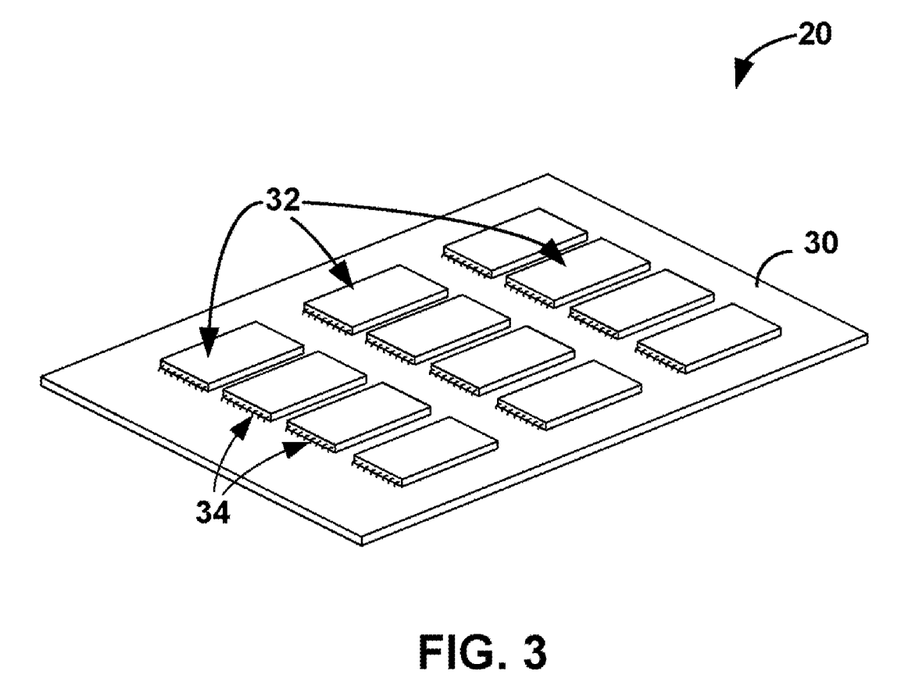
FIG. 3 is a perspective view of an example printed circuit board assembly of the solid state data storage assembly of FIG. 1.

As shown in FIG. 3, which is a schematic illustration of an example printed circuit board assembly 20, printed circuit board assembly 20 can include printed circuit board 30 and electrical components 32. Electrical components 32 include components such as one or more controller chips (e.g., controller integrated circuits) that control the storage and retrieval of data by data storage assembly 10, one or more memory chips (e.g., flash memory, MRAM, SRAM or DRAM chips), one or more passive electrical components (e.g., capacitors or resistors), and the like. Electrical components 32 are electrically and mechanically coupled to printed circuit board 30 using any suitable technique, such as using solder joints or connector pins that are positioned between electrical contacts of electrical components 32 and electrical contacts on printed circuit board 30. In the example shown in FIG. 3, electrical components 32 are soldered onto printed circuit board 20 using a surface mount technology process. As a result, solder joints 34 are formed between each electrical component 32 and printed circuit board 30.

Printed circuit board assembly 20 may include electrical contacts that electrically connect to a plurality of input/output connectors 21, which are each configured to provide as an interface with one or more host device (e.g., a computer, a consumer electronic device, etc.). For example, input/output connectors 21 can be configured to transmit data, power and control signals to and from a host device. Example input/output connectors 21 can, but need not include a service expansion shelf (SES) connector, a serial advanced technology attachment (SATA) connector, and/or a four pin test connector. Frame 14 of housing 12 defines opening 15 through which input/output connectors 21 may be accessed. Printed circuit board assembly 20 can also be electrically connected to additional connectors such as, but not limited to, a pin connector (e.g., a J1 connector, which is a 110-pin connector). The additional connectors may be positioned on any suitable side of printed circuit board assembly 20, such as side 20A substantially opposite side 20B on which connector 21 is positioned.

Printed circuit board 30 may include electrical components on more than one side. Thus, although electrical components 32 are shown on a single side of printed circuit board 30 in the example shown in FIG. 3, in other examples, electrical components 32 may be positioned on more than one side of printed circuit board 30 (e.g., on opposite sides of printed circuit board 30). In addition, although one printed circuit board assembly 20 is shown in FIG. 2, in other examples, data storage assembly 10 may include any suitable number of printed circuit board assemblies, such as two, three or more. If data storage assembly 10 includes a plurality of printed circuit board assemblies, the printed circuit board assemblies may be stacked in a z-axis direction (orthogonal x-y-z axes are shown in FIGS. 1 and 2), stacked in the x-y plane or any combination thereof.

During operation of data storage assembly 10, heat may be generated by electrical components 32 of printed circuit board assembly 20. The generation of heat from the operation of data storage assembly 10 may be especially compounded when a plurality of data storage assemblies 10 are positioned next to each other, e.g., in a device or in a server room or other data center. As heat builds up within housing 12 (FIG. 1), the performance of data storage assembly 10 may degrade and the useful life of electrical components 32 may decrease due to the added stress on components 32 from the relatively high temperature operating environment.

The issue of heat build-up becomes particularly pronounced when housing 12 substantially encloses printed circuit board 20, e.g., as shown in FIGS. 1 and 2, due to limited air circulation within housing 12 as well as the relative small size of housing 12. While one or both covers 16, 18 may be removed from data storage assembly 10 in order to help improve the heat conduction of data storage assembly 10, covers 16, 18 serve various purposes in assembly 10. As a result, other issues may be arise as a result of removing one or both covers 16, 18 from assembly 10. For example, covers 16, 18 provides shock protection to assembly 10 by increasing the stiffness of assembly 10. In addition, covers 16, 18 helps protect printed circuit board 20 and its electrical components 32 from environmental contaminants, such as dust particles, liquids, and the like. Thus, it may be undesirable to remove covers 16, 18 from housing 12 in some instances.

In order to help improve the heat conduction data storage assembly 10, data storage assembly 10 includes thermal interface 22 positioned between printed circuit board assembly 20 and cover 16, and thermal interface 24 positioned between printed circuit board assembly 20 and cover 18. Thermal interfaces 22, 24 contact different sides of printed circuit board assembly 20. In contrast to a thermally insulating material, thermal interfaces 22, 24 each comprise a thermally conductive material, which aids in the conduction of heat away from electrical components 32 of printed circuit board assembly 20 and improves the thermal transfer efficiency of data storage assembly 10. In some examples, thermal interfaces 22, 24 exhibit a thermally conductivity of about 0.1 watts per meter-Kelvin (W/mK) to about 3.0 W/mK, although other thermal conductivities are contemplated. The conduction of heat away from components 32 can help maintain the operational integrity of electrical components 32 and increase the useful life of data storage assembly 10 by decreasing the stress on components 32 that is generated from relatively high operating temperatures. In some examples, thermal interfaces 22, 24 may each comprise a ceramic filled silicone elastomer. However, other thermally conductive materials may also be used to form thermal interfaces 22, 24.

In some examples, thermal interfaces 22, 24 are formed of a substantially mechanically conformable material, such that thermal interfaces 22, 24 are capable of substantially conforming to the topography of printed circuit board assembly 20. In such examples, when thermal interfaces 22, 24 are positioned over printed circuit board assembly 20 and compressed, thermal interfaces 22, 24 may contact one or more surfaces of printed circuit board assembly 20 (e.g., the surface of electrical components 32). Increasing the contact between thermal interfaces 22, 24 and printed circuit board assembly 20 with a conformable material may be desirable in order to increase the conduction of heat away from electrical components 32.

In addition to or instead of being formed from a substantially conformable material, thermal interfaces 22, 24 may each define a plurality of openings (e.g., cutaway portions) that are configured to receive surface protrusions of printed circuit board assembly 20. The surface protrusions may be formed by the placement of electrical components 32 on printed circuit board 30 and extending from printed circuit board 30. In this way, thermal interfaces 22, 24 may better envelop electrical components 32 and increase the surface area for contacting electrical components 32 and conducting heat away from electrical components 32.

Thermal interfaces 22, 24 are each formed from one or more layers of thermally conductive material, which may be substantially continuous in order to define a path of low thermal resistance. In some examples, thermal interfaces 22, 24 each comprise multiple layers of material that may be stacked in a z-axis direction or multiple layers of material that are positioned adjacent each other in the x-y plane.

In the example of data storage assembly 10 shown in FIG. 2, thermal interfaces 22, 24 each define a structure having a stiffness that enables thermal interfaces 22, 24 to be removed from housing 12 while maintaining their structural integrity. For example, thermal interfaces 22, 24 may each be configured such that they may be removed from housing 12 without breaking apart or decomposing upon handling. As a result, thermal interfaces 22, 24 may easily be introduced into and removed from housing 12 without generating particles or other contaminants that may affect the operation of data storage assembly 10.

Configuring thermal interfaces 22, 24 such that they may each be removed from housing 12 without leaving portions of thermally conductive material within housing 12 may be useful, e.g., for purposes of accessing electrical components 32 (FIG. 3) of printed circuit board assembly 20. After assembly of data storage assembly 10, it may be useful to periodically access electrical components 32 in order to repair data storage assembly 10 or otherwise rework electrical components 32. Thermal interfaces 22, 24 that are removable from data storage assembly 10 without substantially adversely affecting the properties of printed circuit board assembly 20 provides a cost-effective technique for aiding the conduction of heat away from printed circuit board assembly 20. In some examples, thermal interfaces 22, 24 may be reused after being removed from housing 12 (e.g., may be replaced in housing 12).

Thermal interfaces 22, 24 may have any suitable thickness. In some examples, thermal interface layers 22, 24 each have a thickness of about 0.1 millimeters (mm) to about 2.0 mm. However, other thicknesses are contemplated and may depend on the dimensions of the particular data storage assembly 10. As described below, in some examples, a thickness of each of thermal interface layers 22, 24 may be selected to fill a space between covers 16, 18 and printed circuit board assembly 20 within housing 12.

When data storage assembly 10 is assembled, there may be an air gap between covers 16, 18 and printed circuit board assembly 20. This air gap may act as a thermal insulator that impedes conduction of heat away electrical components 32 (FIG. 3). As a result, heat generated by components 32 may be retained within housing 12. In examples in which thermal interfaces 22, 24 are sized to fill a space between covers 16, 18, respectively, and printed circuit board assembly 20, thermal interfaces 22, 24 eliminate the air gaps between covers 16, 18 and printed circuit board assembly 20. Thus, by contacting both covers 16, 18 and printed circuit board assembly 20, thermal interfaces 22, 24 each provide a relatively low resistance thermal conduction path from printed circuit board assembly 20, a source of heat, and the exterior of housing 12 (through covers 16, 18), to which the heat may be dissipated. In this way, data storage assembly 10 is configured such that heat can be dissipated through a relatively low resistance thermal pathway including thermal interface material 22, 24, thereby reducing the operating temperatures within housing 12.

The inclusion of thermal interfaces 22, 24 in housing 12 may increase the number of potential uses of data storage assembly 10 and/or decrease the restrictions on the operating environment requirements for data storage assembly 10. For example, the increased ability of data storage assembly 10 to conduct heat away from electrical components 32 may help decrease the cooling requirements for the applications in which data storage assembly 10 is used. Depending on the application in which data storage assembly 10 is used (e.g., within a device or a server room), an external cooling source (e.g., a fan or an air conditioning unit) may be used to help maintain a desirable operating temperature for data storage assembly 10. The increased ability of data storage assembly 10 to conduct heat away from electrical components 32 may help increase the tolerable operating temperature for data storage assembly 10, which may decrease the cooling requirements for data storage assembly 10.

In addition to conducting heat away from electrical components 32 of printed circuit board assembly 20, thermal interfaces 22, 24 may help increase the mechanical robustness of data storage assembly 10. Due to the configuration and placement of thermal interfaces 22, 24 within housing 12, thermal interfaces 22, 24 help protect printed circuit board assembly 20 from damage due to the application of a transient or cumulative mechanical load on housing 12. In this way, thermal interfaces 22, 24 may also be referred to as a shock protector of printed circuit board assembly 20. As described in further detail below, thermal interfaces 22, 24 helps increase the stiffness of data storage assembly 10, as well as limits the movement of electrical components 32 (FIG. 3) relative to printed circuit board 30 (FIG. 3) of printed circuit board assembly 20.

Although solid state data storage assembly 10 can exhibit an increased mechanical robustness compared to disc drives or other data storage devices with moving parts, solid state data storage assembly 10 may still be sensitive to applied mechanical loads. Mechanical loads may be exerted on housing 12 of data storage assembly 10, e.g., when data storage assembly 10 is dropped or when an external force is applied to housing 12. Printed circuit board 30 may flex or bend (e.g., from a planar configuration to a nonplanar configuration) when a shock or another type of mechanical load is applied to housing 12. The bending or flexing of printed circuit board 30 may generate shear stresses that disrupt the mechanical joints between electrical components 32 and printed circuit board 30. For example, if solder joints 34 (FIG. 3) are positioned between electrical components 32 and printed circuit board 30 (FIG. 3), the bending or flexing of printed circuit board 30 may result in the deformation and shearing of solder joints 34. Some shear forces may have a magnitude sufficient to deform at least some of the solder joints 34 (or other mechanical connections between electrical components 32 and printed circuit board 30) to the point of failure. When the mechanical connections between electrical components 32 and printed circuit board 30 fail, electrical components 32 may break loose from printed circuit board 30, which disrupts the electrical connection between electrical components 32 and printed circuit board 30, and compromises the ability of data storage assembly 10 to properly operate.

In some examples, thermal interfaces 22, 24 may be configured (e.g., sized and shaped) to help maintain the mechanical and electrical connection between electrical components 32 and printed circuit board 30 of printed circuit board assembly 20 when a mechanical load is applied to housing 12. In particular, in some examples, thermal interfaces 22, 24 is sized and shaped to contact both printed circuit board assembly 20 and covers 16, 18, respectively, such that the stiffness of printed circuit board assembly 20 is effectively increased. Increasing the stiffness of the printed circuit board assembly can help maintain the integrity of the electrical and mechanical connections (e.g., connector pins or solder joints) between electrical components 32 (FIG. 3) and printed circuit board 30 (FIG. 3) of printed circuit board assembly 20 by minimizing the stresses that are generated at the electrical and mechanical connections when a mechanical load is applied to housing 12.

In particular, positioning thermal interfaces 22, 24 such thermal interfaces 22, 24 contact both printed circuit board assembly 20 and covers 16, 18, respectively, decreases the possibility that printed circuit board 30 will bend or flex when a mechanical load is applied to data storage assembly 10. The contact between covers 16, 18, thermal interfaces 22, 24, respectively, and printed circuit board 30 creates a composite or layered structure that effectively increases the rigidity of data storage assembly 10 and decreases the amount of available space for circuit board 30 to flex, thereby discouraging the bending or flexing of printed circuit board 30. In this way, the positioning of thermal interfaces 22, 24 in housing 12 increases the stiffness of printed circuit board assembly 20, thereby minimizing the magnitude of shear stresses that can result in the failure of the mechanical joints between the electrical components and the printed circuit board.

In some examples, thermal interfaces 22, 24 fill the space between printed circuit board assembly 20 and covers 16, 18, respectively. As a result, when a transient mechanical load is applied to housing 12, thermal interfaces 22, 24 may help hold electrical components 32 in place on printed circuit board 30 by limiting the movement of electrical components 32 relative to printed circuit board 30. This may further help maintain the integrity of the electrical and mechanical connections (e.g., connector pins or solder joints) between electrical components 32 (FIG. 3) and printed circuit board 30 (FIG. 3) of printed circuit board assembly 20 when a mechanical load is applied to housing 12.

In addition, in some examples, thermal interfaces 22, 24 helps distribute a force that is applied to housing 12 across printed circuit board assembly 20, thereby reducing the concentration of mechanical stress generated within printed circuit board assembly 20. In this way, distributing the force across at least a part of printed circuit board assembly 20 may reduce the possibility that the mechanical and electrical joints between electrical components 32 and printed circuit board 30 may break due to the application of external mechanical loads. In some cases, thermal interfaces 22, 24 also dampens the mechanical loads (e.g., shocks) or vibrations that are applied to housing 12 and transmitted to printed circuit board assembly 20. For example, thermal interfaces 22, 24 may each be formed of a material that has an elastomeric property that enables thermal interfaces 22, 24 to absorb some mechanical loads that are applied to housing 12.

In some examples, thermal interfaces 22, 24 are relatively tacky, such that when thermal interfaces 22, 24 are positioned between printed circuit board assembly 20 and covers 16, 18, respectively, and, sized to fill the space between covers 16, 18, respectively, and printed circuit board assembly 20, thermal interfaces 22, 24 adheres to the respective cover 16, 18 and printed circuit board assembly 20. In some examples, at least one of the thermal interfaces 22, 24 has a peel strength in a range of about 0.44 Newton (about 0.1 pound-force) to about 2.22 Newton (0.5 pound-force) for a 5.08 centimeter (2 inch) by 8.89 centimeter (3.5 inch) sample size relative to printed circuit board assembly 20. The adhesion between thermal interfaces 22, 24 and the respective cover 16, 18 and printed circuit board assembly 20 may also help increase the stiffness of data storage assembly 10, which may further improve the shock protection capability of thermal interfaces 22, 24.

In addition, the adhesion between thermal interfaces 22, 24 and the respective cover 16, 18 and printed circuit board assembly 20 may provide a visible indication that data storage assembly 10 has been tampered with. For example, when thermal interfaces 22, 24 are formed from a relatively tacky material, thermal interfaces 22, 24 may adhere to printed circuit board assembly 20 and the respective cover 16, 18 when data storage assembly 10 is first assembled. However, the material from which thermal interfaces 22, 24 are formed may not allow thermal interfaces 22, 24 to readhere as well (if at all) to the respective cover 16, 18 and printed circuit board assembly 20 after data storage assembly 10 is disassembled. Thus, if cover 16 and thermal interface 22 are separated from the other components of data storage assembly 10, e.g., to gain access to electrical components 32 of printed circuit board assembly 20, such tampering with data storage assembly 10 may be evidenced by the lack of adhesion or a decrease in adhesion between thermal interface 22 and printed circuit board assembly 20. The same visual indication of tampering may also be provided by thermal interface 24 if cover 18 and thermal interface 24 are separated from the other components of data storage assembly 10.

It may be desirable to determine whether the internal components of data storage assembly 10 were exposed, thereby indicating tampering with electrical components 32, for various purposes. For example, the manufacturer of data storage assembly 10 may provide a buyer with a limited warranty (e.g., covering manufacturing defects), which may be nullified if the data storage assembly 10 is tampered with. Prior to performing any warranty repairs on a data storage assembly 10, the manufacturer may determine whether data storage assembly 10 has been tampered with by examining the adhesion between thermal interfaces 22, 24 and covers 16, 18, respectively, and printed circuit board assembly 20. A diminished adhesion (e.g., compared to an expected adhesion) between one or both of the thermal interfaces and printed circuit board assembly 20 may indicate that the thermal interface has been removed from housing 12 and subsequently replaced in housing 12.

If thermal interfaces 22, 24 are formed from a substantially conformable material, the manufacturer may also visually inspect thermal interfaces 22, 24 to determine whether the pattern defined by the surface of thermal interfaces 22, 24 facing printed circuit board assembly 20 substantially matches the expected pattern of a thermal interface 22 that has been first removed from housing 12. If pattern defined by the surface of one or both thermal interfaces 22, 24 differs from the expected pattern, it may indicate that the thermal interface has been removed from housing 12 and subsequently replaced in housing 12, thereby indicating data storage assembly 10 has been tampered with.

Example

An experiment was performed to compare the shock resistance of a solid state drive assembly including a thermally conductive interface material compared to a solid state drive assembly that is otherwise similar, but does not include a thermally conductive interface material. A ½ sine pulse shock was applied to a solid state drive assembly including a housing similar to housing 12 shown in FIGS. 1 and 2 and a printed circuit board assembly including a plurality of electrical components soldered to a printed circuit board. In particular, a solid state drive assembly was dropped using a Lansmont Drop Tester (made available by Lansmont Corporation of Monterey, Calif.), which helped maintain the desired orientation of the solid state drive assembly as it was dropped. The acceleration at which the drive assemblies were dropped was determined using Model 352A25 and Model 352C22 accelerometers (made available by PCB Piezotronics, Inc. of Depew, N.Y.).

A plurality of solid state drive assemblies each having a different printed circuit board thickness and excluding a thermal interface material were dropped in various orientations. Table 1 illustrates the accelerations with which the solid state drive assemblies were dropped, the thickness of the printed circuit board of the solid state drive assembly, and a duration of each of the drops. In each of the iterations, the solid state drive assembly was dropped with the solid state drive assembly oriented such that the electrical components were facing in either a positive z-axis direction ("memory array up") or a negative-z-axis direction ("memory array down"), such that the input-output (I/O) connector of the solid state drive assembly was face down (e.g., electrical components facing in positive y-axis direction) or face up (e.g., electrical components facing in negative y-axis direction), or such that a four pin connector of the solid state drive assembly was face up (e.g., electrical components facing in positive x-axis direction) or face down (e.g., electrical components facing in negative x-axis direction). In each of the solid state drive assemblies that were dropped, the four pin connector and the I/O connector are positioned on opposite sides of a housing of the solid state drive assembly.

Iterations 1-3 shown in Table 1 represent the dropping of three solid state drive assemblies each having a printed circuit board thickness of about 0.76 millimeters (mm). Iterations 4-9 shown in Table 1 represent the dropping of a single solid state drive assembly having a printed circuit board thickness of about 0.94 mm. In each subsequent drop for iterations 4-9, the solid state drive assembly was rotated, such that the consequences of dropping the solid state drive assembly in each of a plurality of orientations was determined. Iterations 10-15 shown in Table 1 represent the dropping of a single solid state drive assembly having a printed circuit board thickness of about 1.20 mm. In each subsequent drop for iterations 10-15, the solid state drive assembly was rotated, such that the consequences of dropping the solid state drive assembly in each of a plurality of orientations was determined.

A solid state drive assembly was considered to fail the shock test if, upon visual inspection, any of the electrical components were loose or had fallen off the printed circuit board of the solid state drive assembly.

TABLE 1

| Iteration | Z-axis Acceleration (G) | Y-axis Acceleration (G) | X-axis Acceleration (G) | Duration of Load Application | Pass/Fail | Orientation | Printed Circuit Board Thickness |
|---|---|---|---|---|---|---|---|
| 1 | 1500 G | 0 | 0 | 0.52 ms | Pass | Memory Array Up | 0.76 mm |
| 2 | 1500 G | 0 | 0 | 0.52 ms | Pass | Memory Array Up | 0.76 mm |
| 3 | 1567 G | 0 | 0 | 0.52 ms | Fail | Memory Array Up | 0.76 mm |
| 4 | 1508 G | 0 | 0 | 0.52 ms | Pass | Memory Array Up | 0.94 mm |
| 5 | 0 | 1537 G | 0 | 0.51 ms | Pass | I/O Connector down | 0.94 mm |
| 6 | 0 | 0 | 1584 G | 0.51 ms | Pass | Four pin Connector Up | 0.94 mm |
| 7 | 0 | 0 | −1332 G | 0.52 ms | Pass | Four pin Connector Down | 0.94 mm |
| 8 | 0 | −1523 G | 0 | 0.50 ms | Pass | I/O Connector Up | 0.94 mm |
| 9 | −1534 G | 0 | 0 | 0.52 ms | Fail | Memory Array Down | 0.94 mm |
| 10 | 1521 G | 0 | 0 | 0.50 ms | Pass | Memory Array Up | 1.20 mm |
| 11 | 0 | 1618 G | 0 | 0.48 ms | Pass | I/O Connector down | 1.20 mm |
| 12 | 0 | 0 | 1385 G | 0.48 ms | Pass | Four pin Connector Up | 1.20 mm |
| 13 | 0 | 0 | −1449 G | 0.47 ms | Pass | Four pin Connector Down | 1.20 mm |
| 14 | 0 | −1440 G | 0 | 0.48 ms | Pass | I/O Connector Up | 1.20 mm |
| 15 | −1514 G | 0 | 0 | 0.50 ms | Fail | Memory Array Down | 1.20 mm |

As Table 1 demonstrates at least some of the solid state drive assemblies that did not include a thermal interface material were unable to withstand the applied shock. In particular, the solid state drive assemblies showed a sensitivity to accelerations in a negative z-axis direction.

A solid state drive assembly similar in configuration to those tested to generate the data shown in Table 1 was modified to include a thermal interface material between the covers of the housing and the printed circuit board assembly. The thermal interface material was Bergquist Gap Pad 2202, which is available from Bergquist Company of Chanhassen, Minn., and was selected to have a thickness of about 0.051 mm (about 0.020 inches) to fill the space between the covers of the housing and the printed circuit board assembly. The solid state drive assembly including a thermal interface material was dropped five times using the Lansmont Drop Tester to determine whether the thermal interface material helped improve the ability of the solid state drive assembly to withstand a shock applied to the outer housing.

Table 2 illustrates the various accelerations with which the solid state drive assembly was dropped, as well as the thickness the printed circuit board and a duration of the drop. As with the testing performed to generate the data shown in Table 1, the solid state drive assembly was considered to fail the shock test if, upon visual inspection, any of the electrical components (e.g., memory chips) were loose or had fallen off the printed circuit board of the solid state drive assembly.

components (e.g., the memory array) facing in a positive z-axis direction. This suggests that the thermal interface material improves the shock protection of a solid state drive assembly, and, in particular, the electrical components of a printed circuit board assembly.

Figure 4:
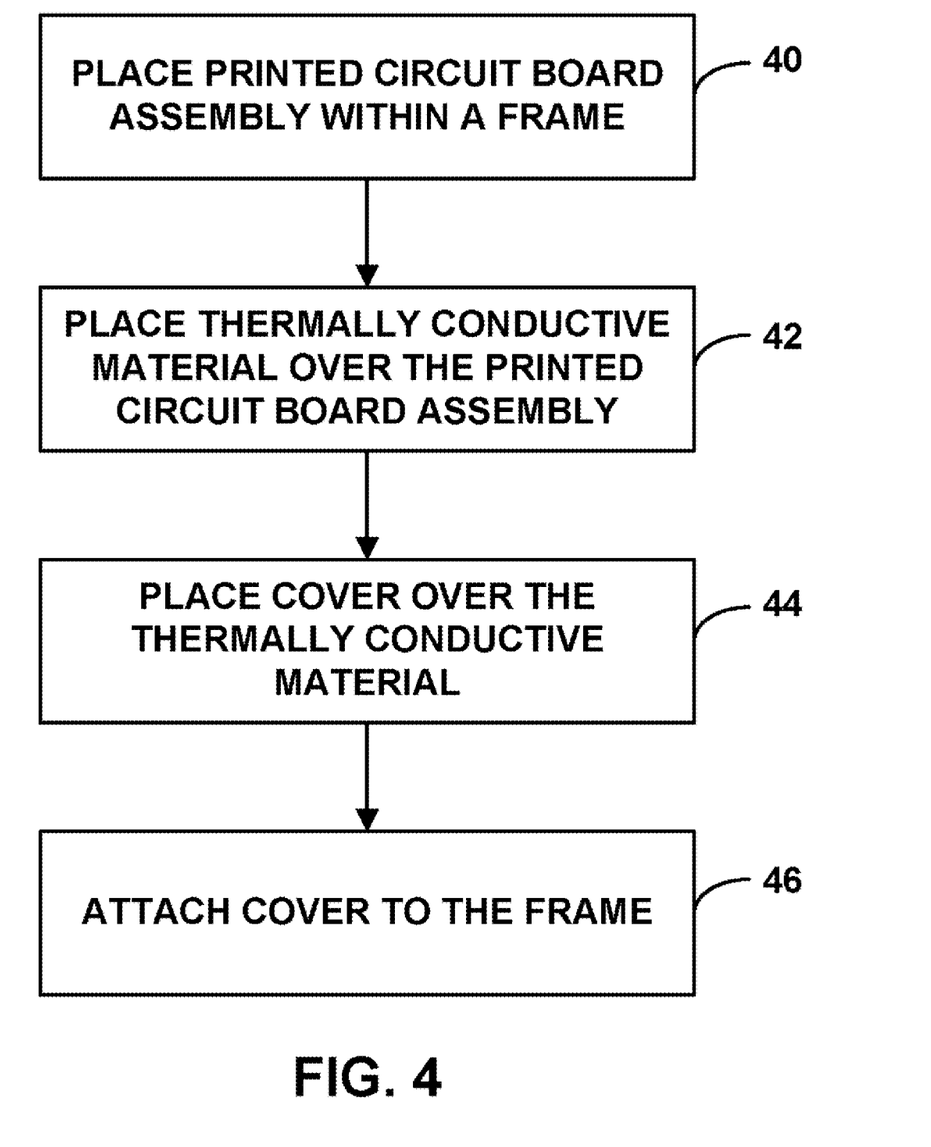
FIG. 4 is a flow diagram of an example technique for forming a solid state data storage assembly that includes a thermal interface material between a housing and a printed circuit board assembly.

FIG. 4 is a flow diagram of an example technique for forming solid state data storage assembly 10. In accordance with the technique shown in FIG. 4, one or more printed circuit board assemblies 20 are placed within frame 14 (40). The one or more printed circuit board assemblies 20 can be attached to frame 14 using any suitable technique. In some examples, frame 14 includes side rails, brackets or other mechanical structures that align with and support the one or more printed circuit board assemblies 20. The one or more printed circuit board assemblies 20 can be mechanically connected to these side rails, brackets or other mechanical structures of frame 14. For example, the one or more printed circuit board assemblies can be connected to frame 14 using one or more screws, connection fingers, locking/clipping structures, adhesives, rivets, other mechanical fasteners, welding (e.g., ultrasonic welding) or combinations thereof.

After placing one or more printed circuit board assemblies 20 within frame 14, thermally conductive material defining thermal interface 22 is placed over printed circuit board assembly 20 (42). In some examples, the thermally conductive material is placed over printed circuit board assembly 20 such that the major surface of printed circuit board assembly

TABLE 2

| Iteration | Z-axis Acceleration (G) | Y-axis Acceleration (G) | X-axis Acceleration (G) | Duration of Load Application | Pass/Fail | Orientation | Printed Circuit Board Thickness |
|---|---|---|---|---|---|---|---|
| 1 | −1513 G | 0 | 0 | 0.52 ms | Pass | Memory Array Up | 1.20 mm |
| 2 | −1637 G | 0 | 0 | 0.52 ms | Pass | Memory Array Up | 1.20 mm |
| 3 | −1765 G | 0 | 0 | 0.52 ms | Pass | Memory Array Up | 1.20 mm |
| 4 | −1867 G | 0 | 0 | 0.52 ms | Pass | Memory Array Up | 1.20 mm |
| 5 | −1957 G | 0 | 0 | 0.52 ms | Pass | Memory Array Up | 1.20 mm |

As Table 2 demonstrates, the solid state drive assembly including a thermal interface material positioned between the covers of the housing and the printed circuit board assembly was able to withstand accelerations up to 1957 G when the solid state drive assembly was dropped with the electrical

20 that is exposed by frame 14 is substantially covered by the thermally conductive material. In this way, thermal interface 22 may be sized and shaped to substantially cover printed circuit board assembly 20. After the thermally conductive material is placed over printed circuit board assembly 20 to define thermal interface 22 (42), cover 16 is positioned over thermal interface 22 (44) and attached to frame 14 (46). Cover 16 can be attached to frame 14 using any suitable technique, such as screws, connection fingers, locking/clipping structures, adhesives, rivets, other mechanical fasteners, welding (e.g., ultrasonic welding) or combinations thereof.

Thermally conductive material can be pre-attached to cover 16 or can separate from cover 16 prior to inclusion in housing 12. In some examples, thermal interface 22 has a thickness that is greater than or equal to a distance between cover 16 and printed circuit board assembly 20. As a result, when cover 16 is positioned over thermal interface 22 (44) and attached to frame 14 (46), thermal interface 22 substantially fills the space between cover 16 and printed circuit board assembly 22. In addition, in examples in which thermal interface 22 has a thickness that is greater than a distance between cover 16 and printed circuit board assembly 22, the attachment of cover 16 to frame 14 compresses thermally interface 22, which may further increase the stiffness of data storage assembly 10. As discussed above, this may help reduce the possibility that printed circuit board 30 (FIG. 3) bends or flexes in the z-axis direction, which can help maintain the integrity of the mechanical and electrical connection between electrical components 32 (FIG. 3) and printed circuit board 30.

In some examples of data storage assembly 10, housing 12 may include a single cover. In other examples, however, housing 12 of data storage assembly 10 includes two covers (e.g., as shown in FIG. 1) or more than two covers. Thus, in some examples of the technique shown in FIG. 4, a thermal conductive material may also be placed over the opposite surface of printed circuit board assembly 20 to define second thermal interface 24, and second cover 18 may subsequently be positioned over second thermal interface 24 and attached to frame 14.

Various examples have been described. These and other examples are within the scope of the following claims.

The invention claimed is:

1. An assembly comprising:
   at least one printed circuit board assembly comprising a printed circuit board and at least one solid state memory component disposed thereon;
   a housing comprising a first cover and a second cover, the housing substantially enclosing the printed circuit board assembly with a space between the printed circuit board assembly and the covers;
   a first compressible thermal interface positioned between the first cover and the printed circuit board assembly and configured to conduct heat away from the printed circuit board assembly; and
   a second compressible thermal interface positioned between the second cover and the printed circuit board assembly and configured to conduct heat away from the printed circuit board assembly, the first thermal interface and the second thermal interface comprising a shock absorbing material, wherein, when installed, the thermal interfaces are compressed and fill the space between the printed circuit board assembly and the covers and provide shock absorption sufficient to withstand an impact of greater than about 1500 G applied to the assembly without detachment of the at least one solid state memory component from the printed circuit board.

2. The assembly of claim 1, wherein each of the thermal interfaces comprises a thermally conductive material having a thermal conductivity of about 0.1 watts per meter-Kelvin (W/mK) to about 3.0 W/mK.

3. The assembly of claim 1, wherein the first and second thermal interfaces comprise a ceramic filled silicone elastomer.

4. The assembly of claim 1, wherein:
   the first thermal interface comprises a compressible material and is sized to substantially cover a first surface of the printed circuit board assembly when the first thermal interface is positioned between the first cover and the printed circuit board assembly; and
   the second thermal interface comprises a compressible material and is sized to substantially cover a second surface of the printed circuit board assembly when the second thermal interface is positioned between the first cover and the printed circuit board assembly.

5. The assembly of claim 4, wherein:
   the first thermal interface, when uninstalled, has a thickness that is greater than a first space between the first cover and the printed circuit board assembly when the printed circuit board assembly is substantially enclosed within the housing; and
   the second thermal interface, when uninstalled, has a thickness that is greater than a second space between the second cover and the printed circuit board assembly when the printed circuit board assembly is substantially enclosed within the housing.

6. The assembly of claim 1, wherein the first thermal interface contacts the first cover and the printed circuit board assembly when the printed circuit board assembly and the first thermal interface are substantially enclosed within the housing and the first thermal interface comprises a plurality of openings configured to receive components of the printed circuit board assembly.

7. The assembly of claim 1, wherein the solid state memory component comprises at least one of a flash memory chip, a magnetic random access memory chip, a static random access memory chip or a dynamic random access memory chip.

8. The assembly of claim 1, wherein each of the first and the second thermal interfaces are configured to show visual indications of tampering and have a peel strength in a range of about 0.44 Newton to about 2.22 Newton.

9. A solid state drive assembly comprising:
   at least one printed circuit board assembly;
   a housing substantially enclosing the printed circuit board assembly with a space between the printed circuit board assembly and the housing, the printed circuit board assembly comprising a printed circuit board with electrical components attached thereon; and
   first and second layers of shock absorbing and thermally conductive material positioned between the housing and the printed circuit board assembly, wherein the first and second layers of the thermally conductive material contacts the housing and substantially covers first and second major surfaces of the printed circuit board assembly and fills the space between the housing and the printed circuit board assembly, wherein the solid state assembly is capable of withstanding an impact having an acceleration up to about 1500 G without detachment of any of the electrical components from the printed circuit board.

10. The assembly of claim 9, wherein the housing comprises a frame, a first cover, and a second cover, wherein the first layer of the thermally conductive material contacts the first cover and the first surface of the printed circuit board assembly and the second layer of the thermally conductive material contacts the second cover and the second surface of the printed circuit board assembly when the first and second layers of the thermally conductive material and the printed circuit board assembly are substantially enclosed within the housing.

11. The assembly of claim 9, wherein the first and second layers of the thermally conductive material comprises a thermal conductivity of comprising a thermal conductivity of about 0.1 watts per meter-Kelvin (W/mK) to about 3.0 W/mK.

12. The assembly of claim 9, wherein the printed circuit board assembly comprises a solid state memory component comprising at least one of a flash memory chip, a magnetic random access memory chip, a static random access memory chip or a dynamic random access memory chip.

13. The assembly of claim 1, wherein the first and second thermal interfaces are sized and shaped to increase stiffness of the printed circuit board assembly sufficient to substantially absorb and distribute impact loads across the printed circuit board assembly.

14. The assembly of claim 9, wherein the first and second layers of the thermally conductive material comprises a shock absorbing material having a thickness of about 0.1 mm to about 2 mm.

15. A method comprising:
  placing a printed circuit board assembly within a housing, wherein the printed circuit board assembly comprises at least one printed circuit board and at least one solid state memory component;
  placing a first layer of compressible, shock absorbing, thermally conductive material over a first surface of the printed circuit board assembly, the first layer substantially covering the first surface;
  placing a second layer of compressible, shock absorbing, thermally conductive material over a second surface of the printed circuit board assembly, the second layer substantially covering the second surface;
  attaching a first cover to the housing, including compressing the first layer of thermally conductive material between the first cover and a first surface of the printed circuit board assembly and filling a space between the attached first cover and the first surface of the printed circuit board assembly; and
  attaching a second cover to the housing, including compressing the second layer of thermally conductive material between the second cover and the second surface of the printed circuit board assembly and filling a space between the attached second cover and the second surface of the printed circuit board assembly.

16. The method of claim 15, wherein the first and second layers of the thermally conductive material comprises a thermal conductivity of about 0.1 watts per meter-Kelvin (W/mK) to about 3.0 W/mK.

17. The method of claim 15, wherein the first and second layers of the thermally conductive material comprises a ceramic filled silicone elastomer.

\* \* \* \* \*